United States Patent [19]
Lilja et al.

[11] Patent Number: 5,286,981
[45] Date of Patent: Feb. 15, 1994

[54] TURN-OFF POWER SEMICONDUCTOR COMPONENT, AND ALSO PROCESS FOR PRODUCING IT

[75] Inventors: Klas Lilja, Fislisbach; Kenneth Johansson, Nussbaumen; Thomas Stockmeier, Würenlingen, all of Switzerland

[73] Assignee: ASEA Brown Boveri Ltd., Baden, Switzerland

[21] Appl. No.: 903,947

[22] Filed: Jun. 26, 1992

[30] Foreign Application Priority Data

Jun. 28, 1991 [DE] Fed. Rep. of Germany ....... 4121375

[51] Int. Cl.$^5$ ..................... H01L 29/74; H01L 27/02; H01L 29/10
[52] U.S. Cl. .................... 257/132; 257/133; 257/146; 257/336; 257/338; 257/341; 437/6; 437/20; 437/26; 437/41; 437/56
[58] Field of Search ........... 357/38, 23.4, 23.9, 357/23.14, 42; 257/132, 133, 146, 162, 177, 336, 337, 338, 341; 437/6, 20, 26, 41, 49, 56

[56] References Cited

U.S. PATENT DOCUMENTS

| | | | |
|---|---|---|---|
| 4,604,638 | 8/1986 | Matsuda | 357/23.4 |
| 4,760,431 | 7/1988 | Nakagawa et al. | 357/23.4 |
| 4,914,496 | 4/1990 | Nakagawa et al. | 357/38 |
| 5,105,244 | 4/1992 | Bauer | 357/38 |

FOREIGN PATENT DOCUMENTS

| | | |
|---|---|---|
| 003070 | 6/1981 | European Pat. Off. . |
| 0454201 | 10/1991 | European Pat. Off. . |

OTHER PUBLICATIONS

"The Insulated Gate Transistor: An New Three-Terminal-MOS Controlled Bipolar Device," B. Jayant Baliga, et al. Jun. 6, 1984, pp. 821-827.
"Onset of Current Filamentation Ingto Devices." K. Lilja, H. Grunning. Jun. 11, 1990, pp. 398-406.
"MOS-Controlled Thyristors-A New Class of Power Devices." Victor A. K. Temple, Nov. 2, 1986, pp. 1609-1618.

*Primary Examiner*—Ngan Ngo
*Attorney, Agent, or Firm*—Oblon, Spivak, McClelland, Maier & Neustadt

[57] ABSTRACT

A turn-off power semiconductor component subdivided into unit cells (EZ), including between an anode (A) and a cathode (K) in a semiconductor substrate (1) five layers in p-n-p-n-p sequence, namely an anode layer (10) an n-type base layer (9), a p-type base layer (8), a turn-off region (6), a cathode region (7) adjoining the turn-off region, and a p-doped short-circuit region (5). On the cathode side in every unit cell (EZ), a first MOSFET (M1) which can be driven via a first insulated gate electrode (G1) is provided for the purpose of switching between the five-layer structure and a conventional thyristor four-layer structure. A second MOSFET (M2) having a second gate electrode (G2) prevents a breakdown between the p-type short-circuit region (5) and the turn-off region (6) during turn-off. p-Type short-circuit region (5), turn-off region (6) and cathode region (7) are introduced in a self-aligning manner into the semiconductor substrate (1) through the windows (F1, F2) between the gate electrodes (G1 and G2, respectively). Current filamentation during turn-off is effectively avoided by the switchable five-layer structure. The self-aligning production makes possible a component having precise patterning.

13 Claims, 8 Drawing Sheets

TURN-OFF POWER SEMICONDUCTOR COMPONENT, AND ALSO PROCESS FOR PRODUCING IT

BACKGROUND OF THE INVENTION

Field of the Invention

The present invention relates to the field of power electronics. It relates to a turn-off power semiconductor component comprising (a) a planar semiconductor substrate having two oppositely situated principal surfaces, of which the first is designed as anode and the second as cathode;

(b) in the semiconductor substrate between the anode and the cathode, a laterally continuous, $n^-$-doped n-type base layer, a $p^+$-doped anode layer which is embedded in the n-type base layer from the anode side and is provided with an anode contact on the first principal surface, and a $p^+$-doped p-type base layer which is embedded in the n-type base layer from the cathode side;

(c) a multiplicity of unit cells arranged alongside to one another and electrically connected in parallel in the semiconductor substrate between the anode and the cathode; and (d) a first MOSFET, which is provided for the purpose of turning off the component, arranged inside each unit cell on the cathode side.

Such a component is disclosed, for example, in a paper by V. A. K. Temple, IEEE Transactions on Electron Devices, Vol. ED-33, No. 10, October 1986, pages 1609–1618 as an MOS-controlled thyristor (MCT).

The invention furthermore relates to a process for producing such a component.

DISCUSSION OF BACKGROUND

Nowadays modern power electronics require fast semiconductor components which can be driven by simple means and can be used in the maximum power ranges.

Nowadays controllable maximum-power semiconductor components are the GTO (gate-turn-off) thyristors. In the GTO, the entire chip area is in principle subdivided into a multiplicity of parallel-connected elementary cells. These components can be turned on and off by means of the gate contact; in this process, however, an enormous circuit complexity has to be accepted for the gate drive owing to the high gate current during turn-off.

The development of MOS-controlled components has therefore been increasingly progressed in power electronics for some years. The advantage of said MOS-controlled components is mainly in the high input impedance at the gate electrode. This makes it possible to drive the component with a comparatively very low expenditure of power.

This trend was initiated by the unipolar power MOSFETs having DMOS structure. However, these DMOSFETs have a serious disadvantage: high breakdown voltages have to be paid for with high forward resistances, which limit the maximum current level, in these components because of the unipolar nature of the conduction.

As is known, higher switchable powers can only be achieved with bipolar structures (for example, thyristors). Nevertheless, the simple and, in particular, low-power control system which is used for the power MOSFETs should, if possible, be adhered to in such bipolar structures.

It has therefore been proposed to implement the concept described of controlling power semiconductor components by means of MOS gates even in components of the maximum power category, namely in thyristors (in this connection, see the paper by V. A. K. Temple mentioned at the outset).

In such an MOS-controlled thyristor or MCT (MOS-controlled thyristor), which, like the GTO, is composed of a multiplicity of adjacently situated parallel-connected unit cells, the turn-off is achieved by short-circuiting the emitter to the p-type base by means of switchable emitter shorts. The switches used in this connection are MOSFETs which are integrated with the emitter and which can naturally be designed optionally as n-channel or p-channel MOSFETs.

In finely structured thyristors of the MCT or GTO type, however, extremely inhomogeneous current-density distributions (filaments) may occur during turn-off (in this connection see K. Lilja and H. Grüning, "Onset of Current Filamentation in GTO Devices", PESC '90, Power Electronics Specialist Conference, pages 398–406 (1990)). In this connection, a small increase in voltage in the p-type base layer results in an exponential growth in the electron injection from the cathode. Under normal conditions this inevitably results in a redistribution and filamentation of the current, which may destroy the component.

To avoid filamentation effects, the earlier U.S. patent application Ser. No. 07/795,375 has already proposed a component in which, instead of the conventional bipolar p-n-p-n thyristor structure composed of four layers, a five-layer structure is now provided between the anode and the cathode, a $p^+$-doped p-type short-circuit region (referred to therein as "contact region") directly connected to the cathode being arranged as fifth layer on the cathode side.

In the ON mode, the p-type short-circuit region is shunted by a MOSFET. During turn-off, however, this additional layer is between the cathode and the p-n-p-n thyristor structure and effectively prevents the electron injection which results in filamentation.

A problem in producing this proposed component, however, is the precise location of the various, differently doped and mutually embedded regions and layers. The usability of a self-aligning process would therefore be desirable.

SUMMARY OF THE INVENTION

The object of the invention is therefore to provide a bipolar power semiconductor component which can be controlled by an insulated gate, is capable of switching maximum powers with freedom from filamentation effects and can at the same time be produced with the necessary precision, and also to provide a process for its production.

The object is achieved in a component of the type mentioned at the outset wherein, inside each unit cell, (e) an $n^+$-doped turn-off region is embedded in the p-type base layer, a p-type short-circuit region which is $p^+$-doped is embedded in its turn in the turn-off region, and an $n^+$-doped first cathode region is embedded in its turn in the p-type short-circuit region, all from the cathode side, the p-type short-circuit region and the first cathode region being provided with a cathode contact on the second principal surface;

(f) an n++-doped second cathode region which adjoins the turn-off region is embedded in the p-type base layer on one side of the turn-off region from the cathode side;

(g) first gate electrode and a second gate electrode are arranged alongside one another and in an insulated manner above the semiconductor substrate on the cathode side and are isolated from one another by a first window, (aa) the first gate electrode spanning a part of the p-type short-circuit region which emerges at the second principal surface on one side of the turn-off region between the first cathode region and the second cathode region and forming together with the first and second cathode regions and the part of the p-type short-circuit region the first MOSFET; and (bb) the second gate electrode spanning a part of the turn-off region which emerges at the second principal surface on the other side of the turn-off region between the p-type short-circuit region and the p-type base layer and forming together with the first and second cathode regions and the part of the turn-off region a second MOSFET; and (h) the p-type short-circuit region and the turn-off region have been introduced into the semiconductor substrate through the first window.

The process according to the invention comprises (a) first introducing the p-type base layer into an n⁻-doped semiconductor substrate forming the n-type base layer from the second principal surface;

(b) then coating the entire area of the second principal surface of the semiconductor substrate with a gate electrode layer having an insulated structure;

(c) then opening the first windows in the gate electrode layer, which windows isolate the first and second gate electrodes from one another in the gate electrode layer; and (d) finally, successively embedding the turn-off regions and the p-type short-circuit regions in the underlying p-type base layer through the first windows.

The essence of the invention is now to provide a five-layer structure between the anode and the cathode instead of the conventional bipolar p-n-p-n thyristor structure composed of four layers, a p+-doped p-type short-circuit region directly connected to the cathode being arranged on the cathode side as the fifth layer. At the same time, turn-off region and p-type short-circuit region are introduced into the semiconductor substrate in a self-aligning manner through a first window between a first and second gate electrode.

In the ON mode, the p-type short-circuit region is shunted by a first MOSFET. Under these circumstances, the injection takes place through a second cathode region arranged alongside the turn-off region. During turn-off, on the other hand, the p-type short-circuit region is situated between the cathode and the p-n-p-n thyristor structure as an additional layer and effectively prevents the electron injection which leads to filamentation.

During turn-off, the holes injected from the anode are removed by turning on a second MOSFET formed from the p-type short-circuit region, the turn-off region, the p-type base layer and a second gate electrode arranged above the n-type emitter layer, and an avalanche breakdown between the p-type short-circuit region and the turn-off region is consequently effectively prevented.

A first preferred embodiment of the component according to the invention is one wherein (a) the various regions and gate electrodes are arranged in each case in mirror-image fashion in adjacent unit cells;

(b) the second gate electrodes of every two adjacent unit cells are combined to form a common second gate electrode;

(c) the p-type base layer and the n-type base layer are brought to the second principal surface between the second cathode regions of two adjacent unit cells;

(d) an insulated third gate electrode is arranged above the parts of the p-type base layer and the n-type base layer emerging at the second principal surface, which gate electrode is in each case isolated from the adjacent first gate electrodes by a second window, through which second window the second cathode region has in each case been introduced into the semiconductor substrate;

(e) the second cathode region, the p-type base layer, the n-type base layer and the third gate electrode form a third MOSFET which produces a switchable connection between the n-type base layer and the turn-off region and serves to turn on the component.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
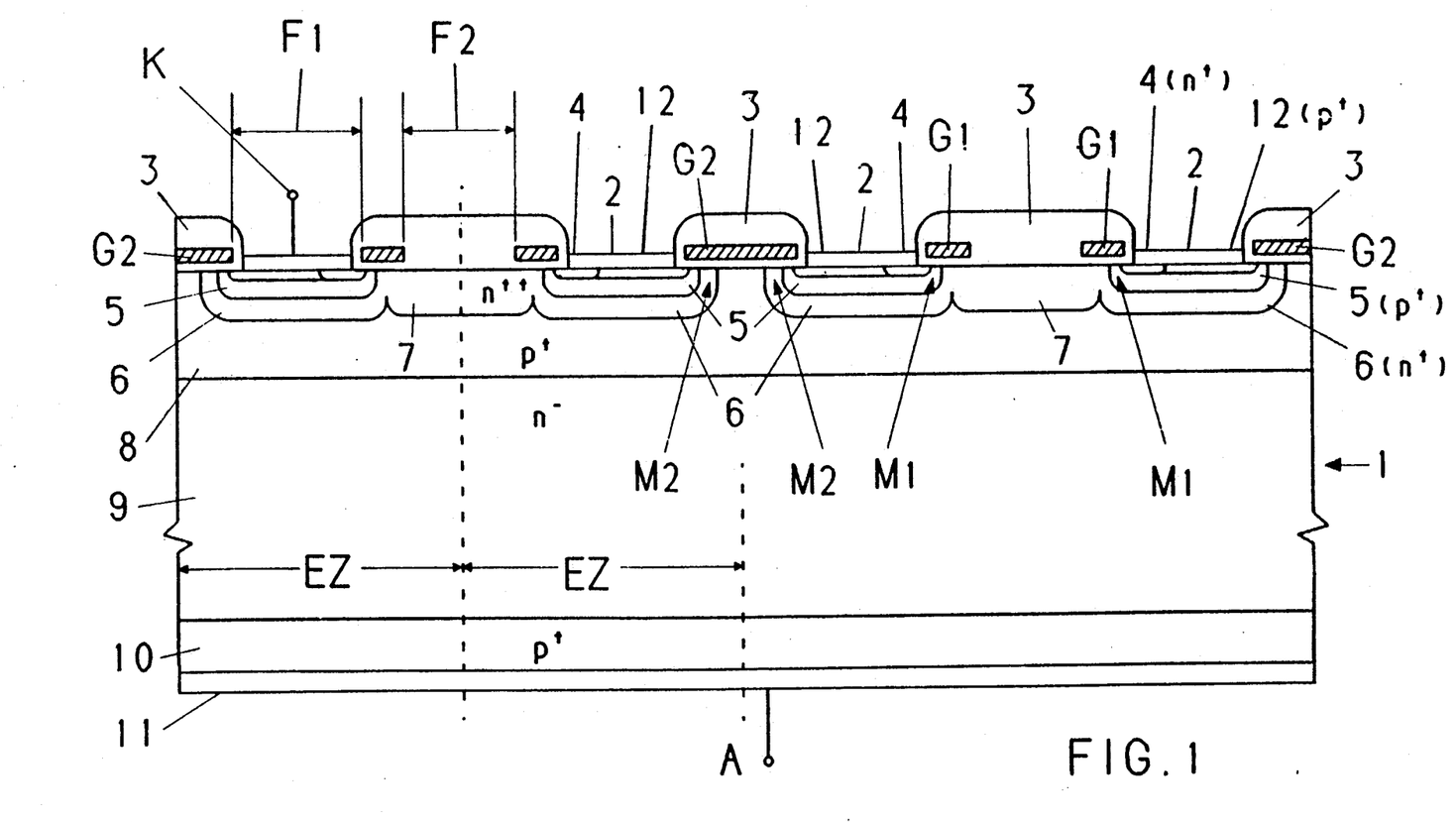
FIG. 1 shows, in cross section, a plurality of unit cells, arranged in pairs in mirror-image fashion, of a component in accordance with a first preferred embodiment of the invention comprising two MOSFETs.

Referring now to the drawings, wherein like reference numerals designate identical or corresponding parts throughout the several views, FIG. 1 shows, in cross section, a plurality of unit cells EZ, arranged in each case in mirror-image fashion with respect to one another, of a preferred embodiment of the component according to the invention. In general, the component is a bipolar switch comprising five layers and controlled by means of an insulated gate, and will therefore be referred to below as an IG-FiBS (insulated-gate-controlled five-layer bipolar switch) for short.

In the embodiment shown, the IG-FiBS comprises a semiconductor substrate 1 with a first (lower) and a second (upper) principal surface. The first principal surface is provided with a (metallic) anode contact 11 which is connected to the anode A. The second principal surface supports, inside each unit cell, a (metallic) cathode contact 2 which is connected in turn to the cathode K.

Arranged between the anode contact 11 and the cathode contact 2 inside the semiconductor substrate 1 is a layer sequence of five layers which are doped with alternating polarity, which layer sequence comprises in succession a p$^+$-doped anode layer 10, an n$^-$-doped n-type base layer 9, a p$^+$-doped p-type base layer 8, an n$^+$-doped turn-off region 6 embedded in the p-type base layer 8, and a p$^+$-doped p-type short-circuit region 5 embedded in the turn-off region 6. At the same time, contact is made to the anode layer 10 by the anode contact 11; contact is made to the p-type short-circuit region 5 or to a p$^+$-doped contact region 12 additionally embedded in the p-type short-circuit region 5 to improve the contact by the cathode contact 2 on the other side of the semiconductor substrate 1.

To the side of the cathode contact 2, a first MOSFET M1 is integrated on one side and a second MOSFET M2 is integrated on the other side into the semiconductor substrate 1 in every unit cell EZ.

The first MOSFET M1 is formed from an n$^+$-doped first cathode region 4 which is embedded in the p-type short-circuit region 5 and connected to the cathode contact 2, the p-type short-circuit region 5, the turn-off region 6 or an n$^{++}$-doped second cathode region 7 adjacent thereto, and a first gate electrode G1 arranged in an insulated fashion (gate insulation 3) above the p-type short-circuit region 5. In this case, the first MOSFET M1 is an n-channel MOSFET whose channel region is part of the p-type short-circuit region 5 emerging at the second principal surface between turn-off region 6 and first cathode region 4.

The second MOSFET M2 is formed from the p-type base layer 8 emerging at the second principal surface, the turn-off region 6, the p-type short-circuit region 5 and a gate electrode G2 arranged in an insulated fashion (gate insulation 3) above the turn-off region 6. In this case, the second MOSFET M2 is a p-channel MOSFET whose channel region is part of the turn-off region 6 emerging at the second principal surface between the tub-shaped p-type short-circuit region 5 and the p-type base layer 8.

In the diagram of FIG. 1 it can be seen that the unit cells in this embodiment are arranged in pairs in mirror-image fashion with respect to one another, each unit cell EZ sharing a common second gate electrode G2 with the adjacent unit cell on one side and a common second cathode region 7 with the adjacent unit cell on the other side. In this way, a first window F1 is formed in each case between the first and second gate electrode G1 and G2, respectively, of each unit cell EZ, and a second window F2 is formed in each case between the first gate electrodes G1 of adjacent unit cells. The turn-off region 6 and the p-type short-circuit region 5 can be successively introduced into the p-type base layer 8 already present through the first windows F1 in a self-aligning manner. The second cathode region 7 is correspondingly introduced through the second windows F2. In these processes, the gate electrodes and the windows situated in between function from the outset as masks for the various implantations.

In an equivalent circuit, the component shown in FIG. 1 can be conceived as an antiparallel series circuit composed of a diode and a thyristor, in which case the diode may be shunted by the first MOSFET M1, while the second MOSFET M2 is connected between the cathode and the gate of the thyristor.

The operation of the component shown in FIG. 1 is as follows: in the turned-on state (ON state), the first gate electrode G1 has a positive gate voltage relative to the cathode K. The first MOSFET M1 is consequently turned-on and shorts the cathode contact 2 to the turn-off region 6 and the adjacent second cathode region 7. In this connection, a particularly good ON behavior results from the heavily n-doped second cathode region, which acts as an effective electron emitter for the rest of the component. The short circuit reduces the active structure of the component to a p-n-p-n sequence of four layers (anode layer 10, n-type base layer 9, p-type base layer 8 and second cathode region 7) which—apart from the channel resistance of the first MOSFET, which can be made very small—behaves like a conventional thyristor. The second MOSFET M2 is turned off in this phase.

In order to turn off the component under these circumstances, the gate voltage at the first gate electrode G1 is reduced, with the result that the first MOSFET M1 switches to the OFF state. As a result, the IG-FiBS is converted from the four-layer to a five-layer (p-n-p-n-p) structure and turns off. It should be noted that, as a result of the additional p-doped turn-off region 5, the electron injection from the cathode side always ceases completely.

At the same time as the first MOSFET M1 is turned off, the second MOSFET M2 is turned on and then accepts the full turn-off current. This is necessary to prevent an avalanche breakdown at the p-n junction between the p-type short-circuit region 5 and the turn-off region 6. Said p-n junction has, after all, a rather low breakdown voltage (in the order of magnitude of 10–20 V), which is far below the blocking capability of the entire component. An avalanche breakdown at said p-n junction would therefore prevent the component from turning off or at least slow down the turn-off process considerably.

Referring to the explanations of the current redistribution which have been given for the GTO and the MCT in the paper by K. Lilja and H. Grüning mentioned at the outset, it is now easy to explain why the IG-FiBS in accordance with the invention does not have any problems with a filamentation of the current: in a GTO or MCT, a slight increase in the voltage at the p-type base layer (corresponding to the p-type base layer 8 in FIG. 1) during the turn-off process results in an exponential increase in the electron injection from the cathode K. As described in the paper cited, this necessarily results in a current redistribution and filamentation (unless the special condition $\beta_{eff} < \beta_{crit}$ is valid).

In the IG-FiBS, on the other hand, the cathode is formed during turn-off by the p-doped p-type short-circuit region 5. For this reason, electron injection is completely impossible. On the contrary, an increase in the current in the IG-FiBS structure during turn-off results in a more rapid removal of the stored charge carriers, i.e. in a more rapid turn-off. The IG-FiBS is therefore self-stabilizing.

The structure shown in FIG. 1 comprises the two MOSFETs M1 and M2 which are both necessary for the turn-off process, as explained above. To switch the component on, a third MOSFET M3 (FIGS. 2A-C; FIG. 3) may then be provided at certain points of the component. Said third MOSFET M3 is basically formed by the n-type base layer 9 brought to the second principal surface, the p-type base layer 8 brought to the second principal surface, the second cathode region 7 (FIG. 2A-C) or the turn-off region 6 (FIG. 3), and an associated gate electrode arranged in an insulated fashion above the part of the p-type base layer 8 emerging at the second principal surface.

Figure 2A:
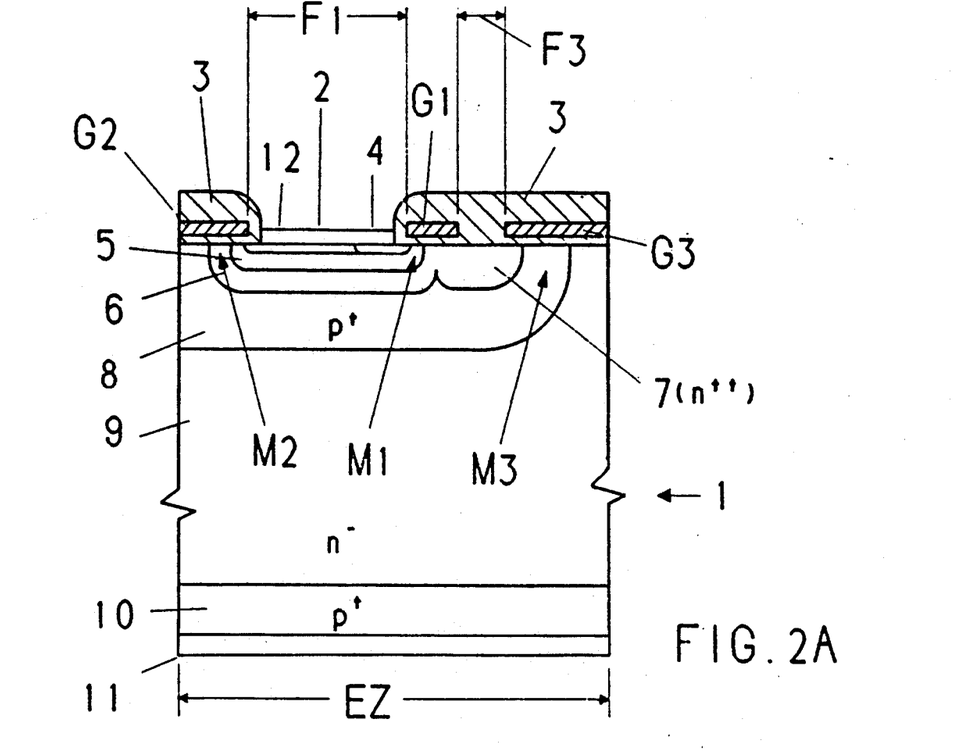
FIG. 2A shows, in cross section, the unit cell of a component in accordance with a second preferred embodiment of the invention comprising three MOSFETs, of which the third is used for turning-on and is arranged in each case between the first MOSFETs of two adjacent unit cells.
Figure 2B:
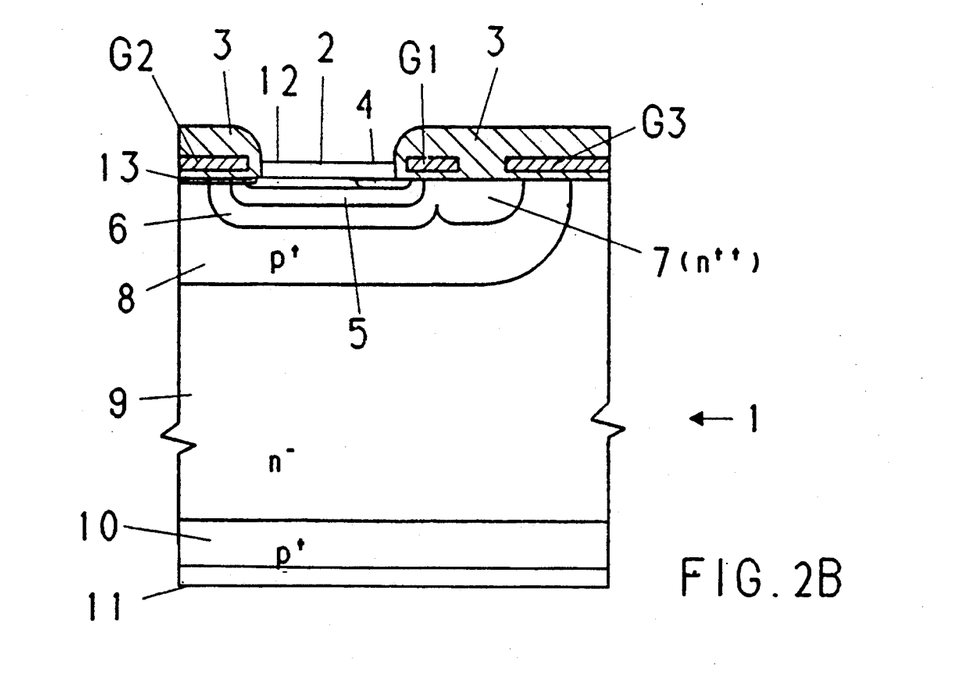
FIG. 2B shows, in cross section, the unit cell of an embodiment which is comparable to FIG. 2A and in which the second MOSFET has been converted into a depletion type by an additional channel implantation region.
Figure 2C:
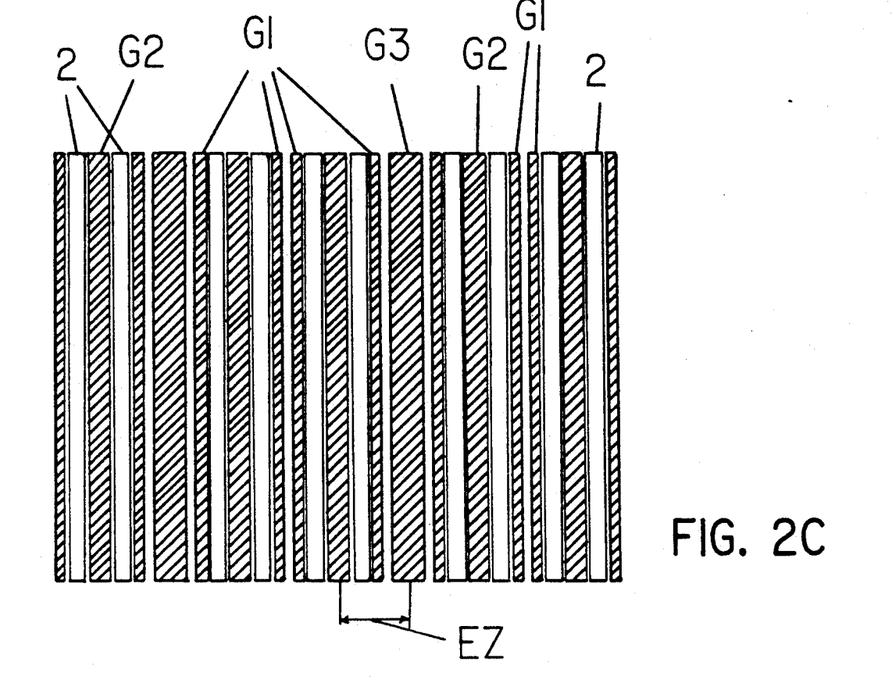
FIG. 2C shows an exemplary arrangement of the various gate electrodes in a component as shown in FIG. 2A, the quantity of the third MOSFETs only being half as large as the quantity of unit cells.
Figure 3:
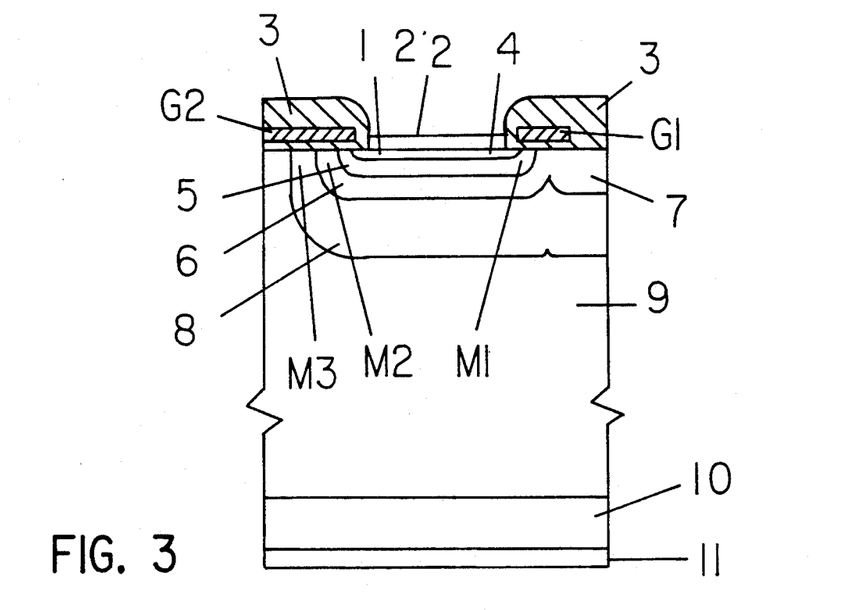
FIG. 3 shows, in cross section, the unit cell of a further preferred embodiment of the component according to the invention comprising three MOSFETs, in which embodiment the second gate electrode is used at the same time as the gate electrode of the third MOSFET.

Said associated gate electrode can, as shown in FIGS. 2A-C, be a separate third gate electrode G3 which is arranged between the first gate electrodes G1 of two adjacent unit cells EZ. In particular, under these circumstances, the chosen quantity of third MOSFETs M3 can be independent of, and less than, the quantity of unit cells EZ, with the result that, for example, there is only one third MOSFET M3 (gate electrode G3) for every two unit cells EZ, as can be seen from the exemplary arrangement of gate electrodes shown in FIG. 2C. In that case, the first and the third gate electrodes G1 and G3, respectively, are isolated from one another by a third window F3 (FIG. 2A) through which the second cathode region 7 can be introduced in a self-aligning manner into the p-type base layer (separately for each unit cell EZ).

The function of the further gate electrode may, however, also be taken on by the second gate electrode G2, as shown in FIG. 3. Such a component is derived from the embodiment shown in FIG. 1 as a result of the fact that the n-type base layer 9 is brought to the second principal surface of the semiconductor substrate 1 underneath certain second gate electrodes G2 or underneath all of them.

While only the five layers and regions present in any case are used in the embodiments of FIGS. 2A and 3 to configure the MOSFETs M1 and M2, in one of these MOSFETs or even in both of them, channel implantation regions (13 in MOSFET M2 in FIG. 2B) with whose aid the threshold voltages of the MOSFETs can be adjusted can additionally be provided from the second principal surface. In the case of the component in FIG. 2B, the p-type channel implantation region 13 converts the second MOSFET M2 from a normally-off MOSFET into a normally-on MOSFET (depletion-type MOSFET).

The components shown in FIGS. 2A-C and 3 can be operated and, in particular, driven in various ways:

ALTERNATIVE 1

In this alternative, the second gate electrode G2 of the second MOSFET M2 is directly short-circuited to the cathode K and is therefore at zero potential. The gates of the MOSFETs M1 and M3 are then driven with an external gate voltage which is the same for both MOSFETs.

The component is initially in the ON state, the gate voltage of the MOSFETs M1 and M3 assuming a positive value (for example, 10 V). M1 and M3 are therefore both turned on and the FiBS behave like a thyristor to which a continuous triggering current is applied. If said gate voltage is now reduced (for example, from +10 V to 0 V), M1 and M3 begin to turn off. The FiBS is then transformed into a 5-layer structure and also begins to turn off. The falling voltage at the blocking junction between turn-off region 6 and p-type short-circuit region 5 consequently rises. As a consequence of this, the voltage of the turn-off region 6 becomes positive with respect to the gate voltage of the second MOSFET M2. Said MOSFET will therefore automatically turn on and take over the hole current coming from the cathode K. As already described above, the FiBS is then able to turn off without problems due to current distribution or filamentation since electron injection from the cathode is reliably suppressed.

To turn on the component, the gate voltage is raised again. M1 and M3 then turn on and the FiBS is again converted into a thyristor, which is triggered by the third MOSFET M3 and naturally turns on. Since the electron injection from the cathode is limited by the current flowing in the MOSFET M1, the current distribution is very much more homogeneous in the FiBS even in the ON state, than in the GTO or MCT.

ALTERNATIVE 2

The same external gate voltage is applied to the gate electrodes G1 to G3 of all three MOSFETs M1 to M3. In the ON state of the FiBS, said gate voltage is held at a positive value (for example, +10 V). To turn off, it is made negative (for example, −10 V) and to turn on it is made positive again.

ALTERNATIVE 3

This alternative is largely identical to alternative 2, except for the circumstance that the second MOSFET M2 (see FIG. 2B) has been converted into a normally-on MOSFET by an additional channel implantation region 13, with the result that a gate voltage of 0 V is sufficient to turn the component off and hold it in the OFF state.

ALTERNATIVE 4

In this case, the second MOSFET M2 is controlled by a different signal from that controlling the first MOSFET M1. During turn-off, the gate voltage of the MOSFET M1 goes from a positive value to zero, and the gate voltage of the MOSFET M2 goes from zero to a negative value. The reverse sequence arises for the turn-on process.

As has already been mentioned, an essential feature of the present invention is the largely self-aligning producibility of the component structure. Selected steps in an exemplary production process for a component as shown in FIG. 2A, which illustrate this self-alignment, are shown in FIGS. 4A to 4F for a unit cell EZ. In these figures, the representation is limited to the cathode side structure for the sake of simplicity.

Figure 4A:
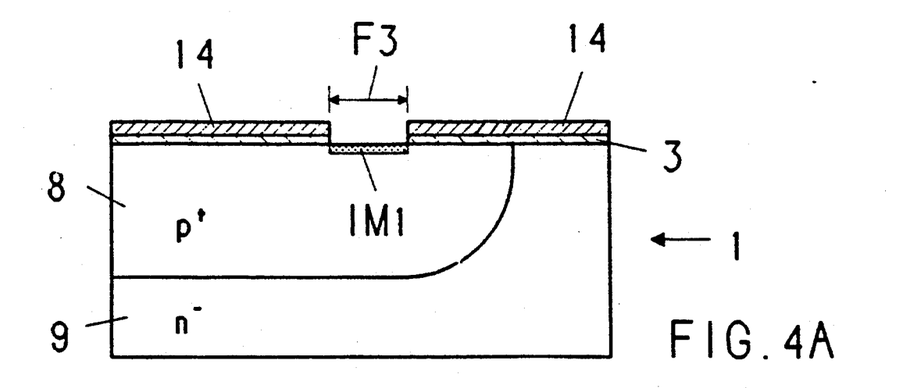
FIGS. 4A-F show various stages in the production of a component as shown in FIG. 2A in accordance with a preferred embodiment of the process according to the invention.
Figure 4B:
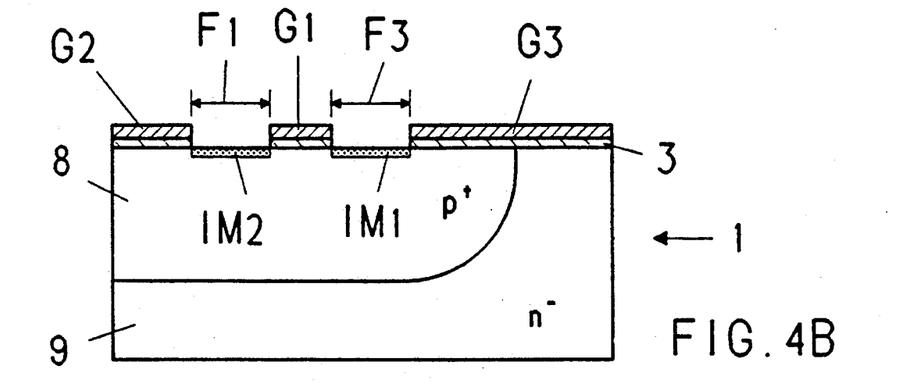
Figure 4C:
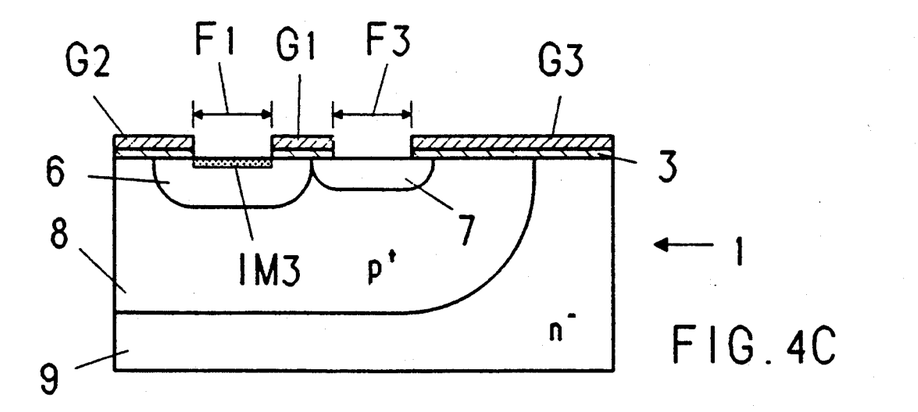
Figure 4D:
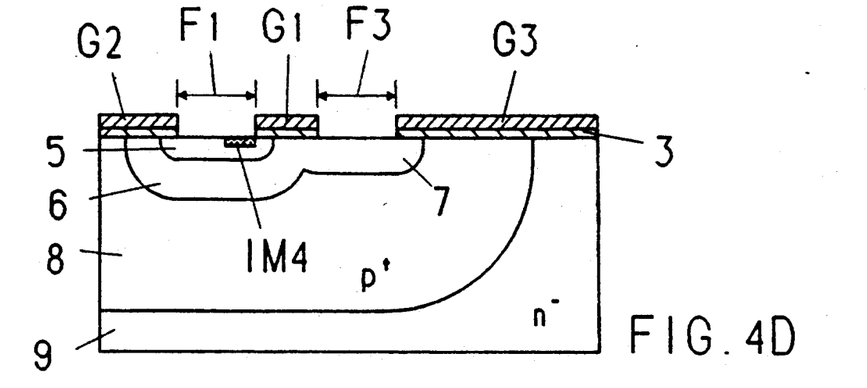

The starting point in the production is an $n^-$-doped semiconductor substrate 1, which forms the n-type base layer 9. Consecutively, the anode layer 10 is introduced into the n-type base layer 9 from the first principal surface and the p-type base layer 8 from the second principal surface. The second principal surface is then coated with the gate insulation 3, on which a continuous poly-Si gate electrode layer 14 is deposited (FIG. 4A). The third window F3, through which a first implantation IM1 is introduced into the semiconductor substrate 1 for the future second cathode region 7, is then opened in said gate electrode 14 by photopatterning and etching. The unit cell has the configuration shown in FIG. 4A at this stage.

The first window F1 is then opened in the gate electrode layer 14 alongside the third window F3. As a result, the gate electrode layer 14 splits up into the future gate electrodes G1, G2 and G3. A second implantation IM2 for the future turn-off region 6 is introduced into the semiconductor substrate 1 through the first window F1. The unit cell has the configuration shown in FIG. 4B at this stage.

A drive-in subsequent to this already forms, in a first stage, the turn-off region 6 and the second cathode region 7, with the result that a third implantation IM3 for the future p-type short-circuit region 5 can then be introduced into the turn-off region 6 through the first window F1. The unit cell has the configuration shown in FIG. 4C at this stage.

A further drive-in develops the regions 6 and 7 further and causes the p-type short-circuit region 5 to be produced. The first window F1 is then partially screened with the aid of an additional mask (not shown) and a width-limited fourth implantation IM4 for the future first cathode region 4 is introduced into the p-type short-circuit region 5 inside the first window F1. The additional mask is then removed again. The unit cell has the configuration shown in FIG. 4D at this stage.

Figure 4E:
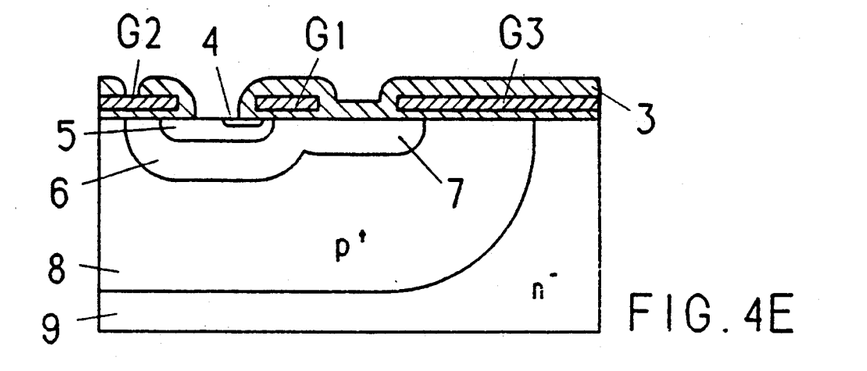
Figure 4F:
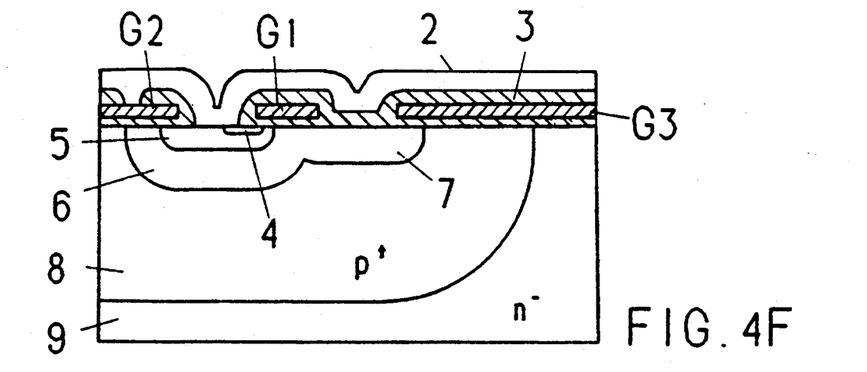

A subsequent drive-in then forms the first cathode region 4. The gate electrodes G1, G2 and G3 are then completely screened and two openings are etched in the gate insulation 3 to make contact to the second gate electrode G2 and for the cathode terminal (FIG. 4E). Finally, a continuous cathode contact 2 is deposited on the gate insulation 3 which simultaneously makes contact to the second gate electrode G2, the first cathode region 4 and the p-type short-circuit region 5 through the two openings (FIG. 4F). In this embodiment, the gate electrode G2 is consequently directly connected to the cathode K in accordance with the drive alternative 1 explained above.

Figure 5:
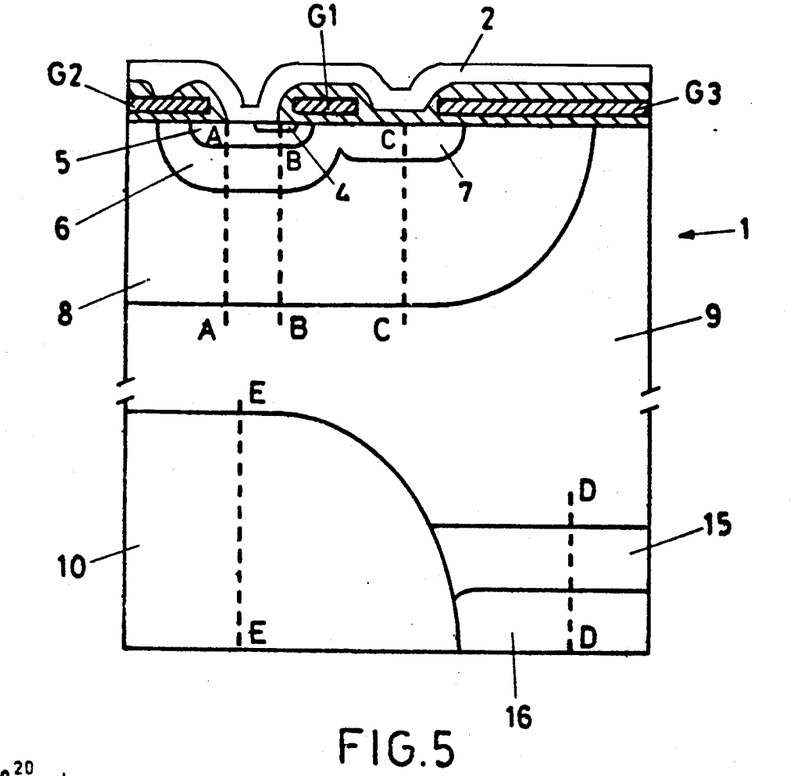
FIG. 5 shows, in cross section, the unit cell of an embodiment, analogous to FIG. 2A, of the component according to the invention in which shorts are additionally provided on the anode side.
Figure 6A:
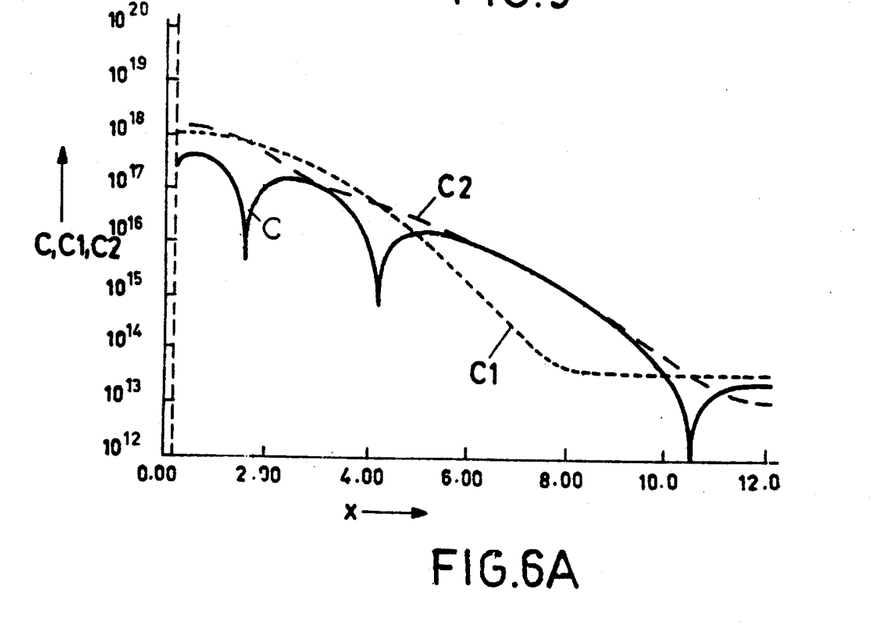
FIG. 6A–E shows the different variations in the doping concentration along the sections A—A to E—E shown in FIG. 5.
Figure 6B:
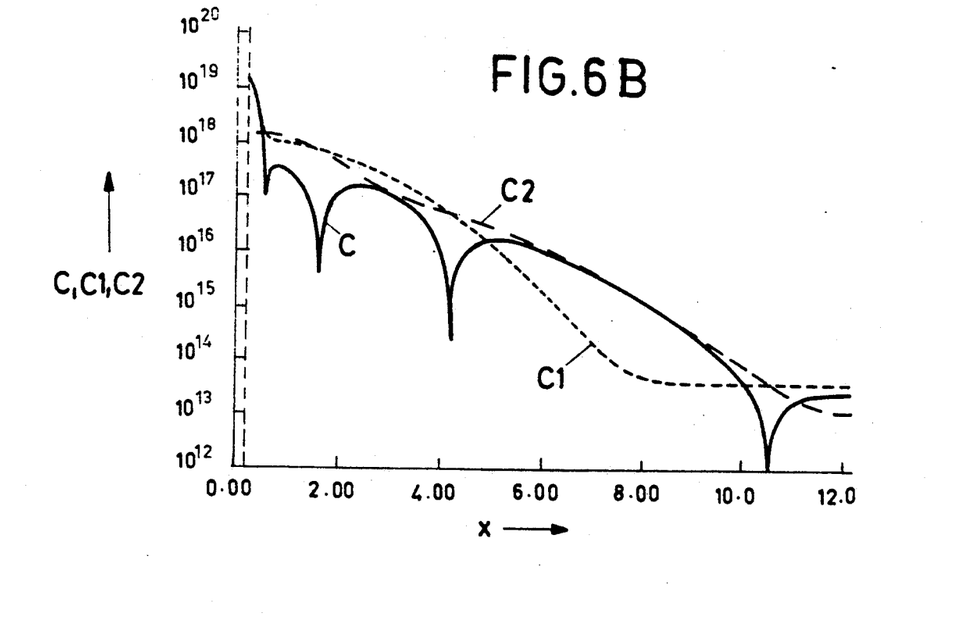
Figure 6C:
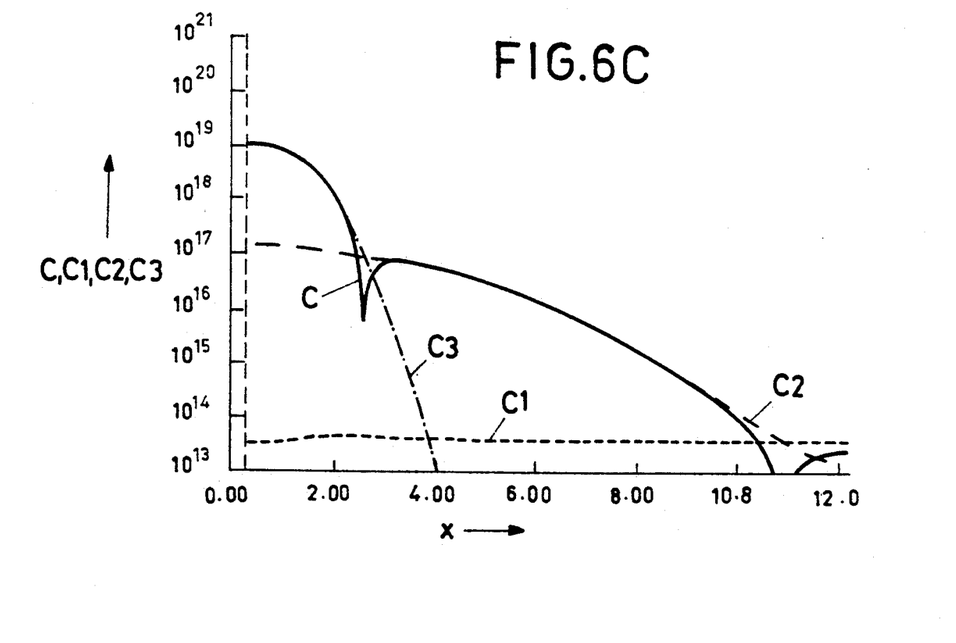
Figure 6D:
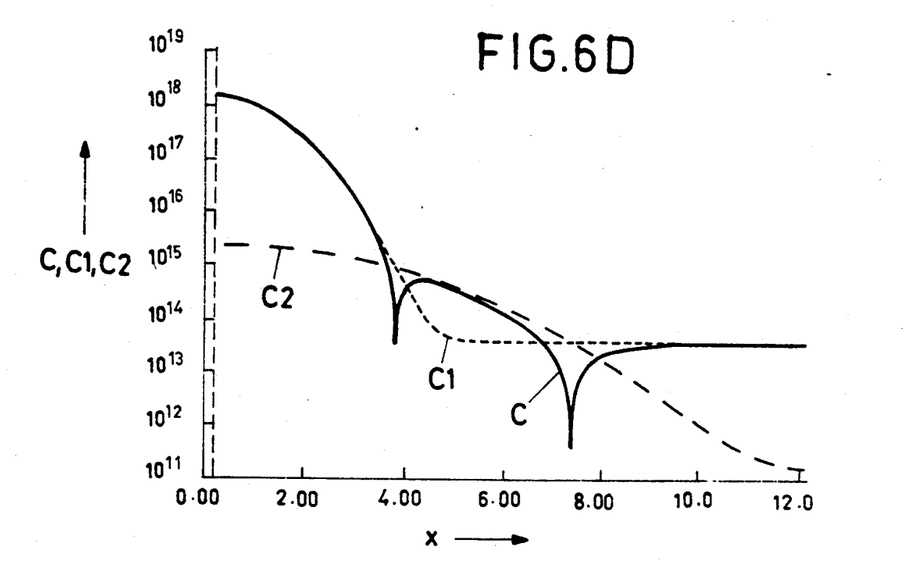
Figure 6E:
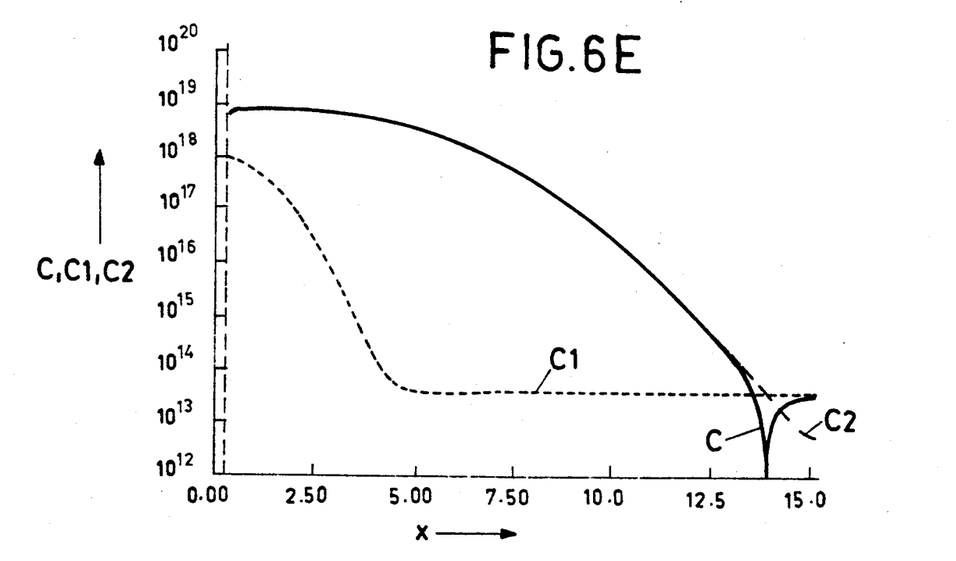

The complete unit cell of the component produced in this process has the structure shown in FIG. 5. In this case, an additional n-type short-circuit region 16 (anode short) and a p-type zone arranged between n-type short-circuit region 16 and n-type base layer 9 are provided on the anode side (in this connection, see, for example, EP-A1-0 327 901). Exemplary variations in the doping concentrations along the section lines A—A to E—E shown in broken form in FIG. 5 are correspondingly shown in FIGS. 6A to 6E. In this connection, "x" denotes the depth measured from the respective principal surface in $\mu$m, "c" denotes the total doping concentration (in $cm^{-3}$), "c1" denotes the concentration of P, "c2" denotes the concentration of B, and "c3" denotes the concentration of As (all in $cm^{-3}$).

The designs hitherto have related to a component having p-n-p-n-p layer sequence in which the individual layers and regions have a doping of a certain type. However, it is within the scope of the invention to replace all the layers 8, 9 and 10 and regions 4, 5, 6, 7, 12 inside the semiconductor substrate 1 by corresponding layers and regions having complementary doping; the $p^+$-doped anode layer 10 is then converted into a $n^+$-doped n-type emitter layer, the n-doped n-type base layer 9 into a p-doped p-type base layer, etc.

All in all, the invention results in a readily drivable high-power component which can be reliably turned off, in which filamentation of the current is avoided during turn-off and which can be produced comparatively simply and with high precision.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A turn-off power semiconductor component comprising:
   (a) a planar semiconductor substrate having two oppositely situated principal surfaces, of which the first is designed as an anode and the second as a cathode;
   (b) in the semiconductor substrate between the anode and the cathode, a laterally continuous, n-type base layer which is $n^-$-doped a $p^+$-doped anode layer which is embedded in the n-type base layer from the anode side and is provided with an anode contact on the first principal surface, and a p-type base layer which is $p^+$-doped and embedded in the n-type base layer from the cathode side;
   (c) a multiplicity of unit cells arranged alongside to one another and electrically connected in parallel in the semiconductor substrate between the anode and the cathode; and
   (d) a first MOSFET, which is provided for the purpose of turning off the component, arranged inside each unit cell on the cathode side;
   wherein, inside each unit cell,
   (e) an $n^+$-doped turn-off region is embedded in the p-type base layer, a p-type short-circuit region which is $p^+$-doped is embedded in its turn in the turn-off region and an $n^+$-doped first cathode region is embedded in its turn in the p-type short-circuit region, all from the cathode side, the p-type short-circuit region and the first cathode region being provided with a cathode contact on the second principal surface;
   (f) an $n^{++}$-doped second cathode region which adjoins the turn-off region is embedded in the p-type base layer on one side of the turn-off region from the cathode side;
   (g) a part of the $p^+$-doped short-circuit region emerges at the second principal surface on one side of the turn-off region between the first and second cathode regions;
   (h) a part of the $n^+$-doped turn-off region emerges at the second principal surface on the other side of the turn-off region between the p-type short-circuit region and the p-type base layer;

(i) a first gate electrode and a second gate electrode are arranged alongside one another and in an insulated manner above the semiconductor substrate on the cathode side and are isolated from one another by a first window, (aa) the first gate electrode spanning said part of the p-type short-circuit region which emerges at the second principal surface on one side of the turn-off region between the first cathode region and the second cathode region and forming together with said first and second cathode regions and said part of said p-type short-circuit region the first MOSFET; and (bb) the second gate electrode spanning said part of the turn-off region which emerges at the second principal surface on the other side of the turn-off region between the p-type short-circuit region and the p-type base layer and forming together with said first and second cathode regions and said part of said turn-off region a second MOSFET; and (j) the p-type short-circuit region and the turn-off region have been introduced into the semiconductor substrate through the first window.

2. The component as claimed in claim 1, wherein:

(a) said first and second cathode regions, p-type short-circuit region, turn-off region, and gate electrodes are arranged in mirror-image fashion in adjacent unit cells; and (b) the first gate electrodes of said adjacent unit cells are isolated from one another by a second window, through which second window the common second cathode region has been introduced into the semiconductor substrate.

3. The component as claimed in claim 2, wherein:

(a) the second cathode region of every two adjacent units cells are combined to form a common second cathode region; and (b) the first gate electrodes of said adjacent unit cells are isolated from one another by a second window, through which second window the common second cathode region has been introduced into the semiconductor substrate.

4. The component as claimed in claim 3, wherein:

(a) a third MOSFET for turning on the component is provided inside certain unit cells on the cathode side;

(b) the third MOSFET produces a switchable connection between the n-type base layer and the turn-off region; and (c) the third MOSFET is formed from the second gate electrode, the n-type base layer brought to the second principal surface underneath the second gate electrode, the adjacent p-type base layer, and the turn-off region.

5. The component as claimed in claim 2, wherein:

(a) a part of the p-type base layer and a part of the n-type base layer are brought to the second principal surface between the second cathode regions of two adjacent unit cells;

(b) an insulated third gate electrode is arranged above the parts of the p-type base layer and of the n-type base layer emerging at the second principal surface, which third gate electrode is isolated from the adjacent first gate electrodes by a window, through which window the second cathode region has been introduced into the semiconductor substrate; and (c) the second cathode region, the p-type base layer, the n-type base layer and the third gate electrode form a third MOSFET which produces a switchable connection between the n-type base layer and the turn-off region and serves to turn on the component.

6. The component as claimed in either of claims 4 and 5, wherein the quantity of third MOSFETs is less than the quantity of unit cells.

7. The component as claimed in any of claims 1–6, wherein, in the first MOSFET or in the second MOSFET or in both MOSFETs an additional channel implantation region, which transforms the respective MOSFET into a MOSFET of the depletion type, is provided underneath the corresponding gate electrode at the second principal surface of the semiconductor substrate.

8. The component as claimed in any of claims 1–4, wherein a $p^+$-doped contact region, to which contact is made by the cathode contact, is embedded in the p-type short-circuit region in each unit cell from the second principal surface and adjacently to the first cathode region.

9. The component as claimed in any of claims 1–4, wherein all the layers and regions inside the semiconductor substrate are replaced by corresponding layers and regions having complementary doping.

10. The component as claimed in any of claims 1–5, wherein the second gate electrode of the second MOSFET is directly connected electrically to the cathode contact.

11. A process for producing a power semiconductor component including, (a) a planar semiconductor substrate having two oppositely situated principal surfaces, of which the first is designed as an anode and the second as a cathode, (b) in the semiconductor substrate between the anode and the cathode, a laterally continuous, n-type base layer which is $n^-$-doped, a $p^+$-doped anode layer which is embedded in the n-type base layer from the anode side and is provided with an anode contact on the first principal surface, and a p-type base layer which is $p^+$-doped and embedded in the n-type base layer from the cathode side, (c) a multiplicity of unit cells arranged alongside to one another and electrically connected in parallel in the semiconductor substrate between the anode and the cathode, and (d) a first MOSFET, which is provided for the purpose of turning off the component, arranged inside each unit cell on the cathode side, wherein, inside each unit cell, (e) an $n^+$-doped turn-off region is embedded in the p-type base layer, a short-circuit region which is $p^+$-doped is embedded in its turn in the turn-off region and an $n^+$-doped first cathode region is embedded in its turn in the p-type short-circuit region, all from the cathode side, the p-type short-circuit region and the first cathode region being provided with a cathode contact on the second principal surface, (f) an $n^{++}$-doped second cathode region which adjoins the turn-off region is embedded in the p-type base layer on one side of the turn-off region from the cathode side, (g) a part of the $p^+$-doped short-circuit region emerges at the second principal surface on one side of the turn-off region between the first and second cathode regions, (h) a part of the n+-doped turn-off region emerges at the second principal surface on the other side of the turn-off region between the p-type short-circuit region and the p-type base layer, (i) a first gate electrode and a second gate electrode are arranged alongside one another and in an insulated manner above the semiconductor substrate on the cathode side and are isolated from one another by a first window, (aa) the first gate electrode spanning said part of the p-type short-circuit region which emerges at the second principal surface on one side of the turn-off region between the first cathode region and the second cathode region and forming together with said first and second cathode regions and said part of said p-type short-circuit region the first MOSFET, and (bb) the second gate electrode spanning said part of the turn-off region which emerges at the second principal surface on the other side of the turn-off region between the p-type short-circuit region and the p-type base layer and forming together with said first and second cathode regions and said part of said turn-off region a second MOSFET, and (j) the p-type short-circuit region and the turn-off region have been introduced into the semiconductor substrate through the first window, which process comprises:

(a') first introducing the p-type base layer into an n⁻-doped semiconductor substrate forming the type base layer from the second principal surface;

(b') then coating the entire area of the second principal surface of the semiconductor substrate with a gate electrode layer having an insulated structure;

(c') then opening the first windows in the gate electrode layer, which windows isolate the first and second gate electrodes from one another in the gate electrode layer; and (d') finally, successively embedding the turn-off regions and the p-type short-circuit regions in the underlying p-type base layer through the first windows.

12. The process as claimed in claim 11, wherein second and third windows are opened in the gate electrode layer alongside the first windows, through which second and third windows the second cathode regions are embedded in the p-type base layer underneath.

13. The process as claimed in either of claims 11 or 12, wherein a poly-Si layer is used as the gate electrode layer and the regions are embedded in the p-type base layer by means of consecutive implantations through the windows and subsequent drive-in.

* * * * *